United States Patent
Robinson

(10) Patent No.: US 12,342,474 B2
(45) Date of Patent: Jun. 24, 2025

(54) CUSTOMIZED THERMAL PATHWAYS IN A PCB

(71) Applicant: DSBJ Pte. Ltd., Singapore (SG)

(72) Inventor: Todd Robinson, San Mateo, CA (US)

( * ) Notice: Subject to any disclaimer, the term of this patent is extended or adjusted under 35 U.S.C. 154(b) by 266 days.

(21) Appl. No.: 17/809,950

(22) Filed: Jun. 30, 2022

(65) Prior Publication Data
US 2024/0008190 A1  Jan. 4, 2024

(51) Int. Cl.
| | |
|---|---|
| *H05K 1/02* | (2006.01) |
| *H05K 1/11* | (2006.01) |
| *H05K 3/12* | (2006.01) |
| *H05K 3/40* | (2006.01) |
| *H05K 3/46* | (2006.01) |

(52) U.S. Cl.
CPC .......... *H05K 3/4652* (2013.01); *H05K 1/021* (2013.01); *H05K 1/115* (2013.01); *H05K 3/1283* (2013.01); *H05K 3/4053* (2013.01); *H05K 3/4697* (2013.01); *H05K 2201/066* (2013.01)

(58) Field of Classification Search
CPC ...... H05K 1/0206; H05K 1/021; H05K 1/115; H05K 1/02; H05K 1/11; H05K 2201/066; H05K 2201/09845; H05K 2203/061; H05K 3/1283; H05K 3/4053; H05K 3/4652; H05K 3/4697; H05K 3/12; H05K 3/40; H05K 3/46

USPC .......................................................... 174/260
See application file for complete search history.

(56) References Cited

U.S. PATENT DOCUMENTS

| | | | |
|---|---|---|---|
| 11,160,160 B1* | 10/2021 | Berkel | .................... H01L 23/13 |
| 2012/0007252 A1* | 1/2012 | Tseng | .................. H01L 23/3677 |
| | | | 257/774 |
| 2020/0214121 A1 | 7/2020 | Zinn | |
| 2021/0320078 A1 | 10/2021 | Zinn | |

* cited by examiner

*Primary Examiner* — Timothy J Thompson
*Assistant Examiner* — Guillermo J Egoavil
(74) *Attorney, Agent, or Firm* — Carlson, Caspers, Vandenburgh & Lindquist, P.A.

(57) ABSTRACT

Embodiments and fabrication methods for a printed circuit board are provided. The embodiments include milling a first cavity in a first sub-lam, wherein the first cavity extends partially through the first sub-lam and milling a second cavity in a prepreg layer. The first sub-lam, the prepreg layer, and a material sheet are stacked and laminated to form a composite cavity from the first cavity and the second cavity. The embodiments also include removing from the laminated stack one or more portions of the first sub-lam covering the first cavity to expose the composite cavity. Conductive paste is placed in the composite cavity of the laminated stack and sintered to form one or more thermal pathways in the laminated stack.

14 Claims, 27 Drawing Sheets

CUSTOMIZED THERMAL PATHWAYS IN A PCB

BACKGROUND

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheets and non-conductive substrates. Conductors on different layers are interconnected with plated through-holes or holes filled with conductive material called vias.

Typically, the major heat generating component(s), such as a die(s) or packaged IC(s) are mounted on one side of the PCB (referred to herein as the "front" side) and one or more heat sinks are mounted to the reverse side of the PCB (referred to herein as the "back" side). For the heat sinks to be effective, heat generated by the heat generating components is transferred through the PCB to the heat sink(s) on the back side.

Because of the non-conductive "insulating" layers in the PCB, heat does not naturally transfer well from the front side to the back side of the PCB. To aid in heat transfer, one or more thermally conductive pathways are formed from the front side to the back side of the PCB. The heat generating component(s) and heat sink(s) are then mounted on or otherwise thermally coupled to the thermally conductive pathways providing a more efficient path for heat from the component(s) on the front side to travel to and be dissipated by the heat sink(s) on the back side.

A thermally conductive pathway can take the form of one or more narrow columns of metal (commonly referred to as a "via") or a larger solid piece of metal (commonly referred to as a metal coin or slug). A via is typically a through-hole in the PCB that is plated with one or more metals or filled with conductive material. Metal coins or slugs are included in a PCB by cutting an appropriately sized cavity and inserting a pre-formed solid coin. As thermal requirements become more challenging with reduced semiconductor size and increased power requirements, more advanced means of dissipating heat from a component on a front side of a PCB to a heatsink on a back side of the PCB would be advantageous.

BRIEF DESCRIPTION

A method for fabricating printed circuit boards is disclosed. The method includes milling a first cavity in a first sub-lam, wherein the first cavity extends partially through the first sub-lam and milling a second cavity in a prepreg layer. The method includes stacking the first sub-lam, the prepreg layer, and a material sheet to form a stack wherein the prepreg layer is disposed between the first sub-lam and the material sheet. Stacking includes aligning the first cavity and the second cavity and orienting the first sub-lam such that the first cavity opens toward the second cavity forming a composite cavity from the first cavity and the second cavity. The method also includes laminating the stack including the first sub-lam, the prepreg layer, and the material sheet to form a laminated stack having a first side proximate the first sub-lam and a second side reverse of the first side. The method also includes removing from the laminated stack one or more portions of the first sub-lam covering the first cavity to expose the composite cavity to the first side. Conductive paste is placed in the composite cavity of the laminated stack; and sintered to form one or more thermal pathways in the laminated stack.

Another method of fabricating a printed circuit board is also disclosed. The method includes forming a plurality of first cavities in a first sub-lam and a plurality of second cavities in a second sub-lam, wherein the plurality of first cavities extend partially through the first sub-lam and the plurality of second cavities extend partially through the second sub-lam. A plurality of third cavities are formed in a prepreg layer. The first sub-lam, the second sub-lam, and the prepreg layer are stacked such that the prepreg layer is disposed in between the first sub-lam and the second sub-lam. Stacking includes aligning the plurality of first cavities and the plurality of second cavities with respective cavities of the plurality of third cavities. Stacking also includes orienting the plurality of first cavities and the plurality of second cavities to open toward the plurality of third cavities forming a plurality of composite cavities from the plurality of first cavities, the plurality of second cavities, and the plurality of third cavities. The first sub-lam, the second sub-lam, and the prepreg layer are laminated together to form a laminated stack having a first side and a second side. Portions of the first sub-lam and the second sub-lam that cover the plurality of first cavities and the plurality of second cavities are removed to expose the plurality of composite cavities to the first side and the second side. Conductive paste is placed in the composite cavity and sintered to form a plurality of thermal pathways extending from the first side to the second side of the laminated stack.

A printed circuit board is also disclosed. The printed circuit board includes a laminated stack having a first side and a second side reverse of the first side. The laminated stack has a plurality of electrically conductive layers and one or more electrically non-conductive layers disposed between respective layers of the plurality of electrically conductive layers. The laminated stack includes a first electrically conductive layer exposed at the first side and a first electrically non-conductive layer adjacent to the first conductive layer. A thermal pathway extends through the laminated stack from the first side to the second side. The thermal pathway has a first horizontal cross-sectional area as it extends through the first non-conductive layer and has a larger horizontal cross-sectional area as it extends through at least one other non-conductive layer.

DRAWINGS

Understanding that the drawings depict only exemplary embodiments and are not therefore to be considered limiting in scope, the exemplary embodiments will be described with additional specificity and detail through the use of the accompanying drawings, in which.

FIGS. 15A-G are vertical cross-sectional views of example stages in creating a laminated stack for a PCB having a customized thermal pathway; and FIGS. 16A-E are vertical cross-sectional views of example stages in adding material sheets to a laminated stack for creating a customized thermal pathway.

DETAILED DESCRIPTION

Figure 1:
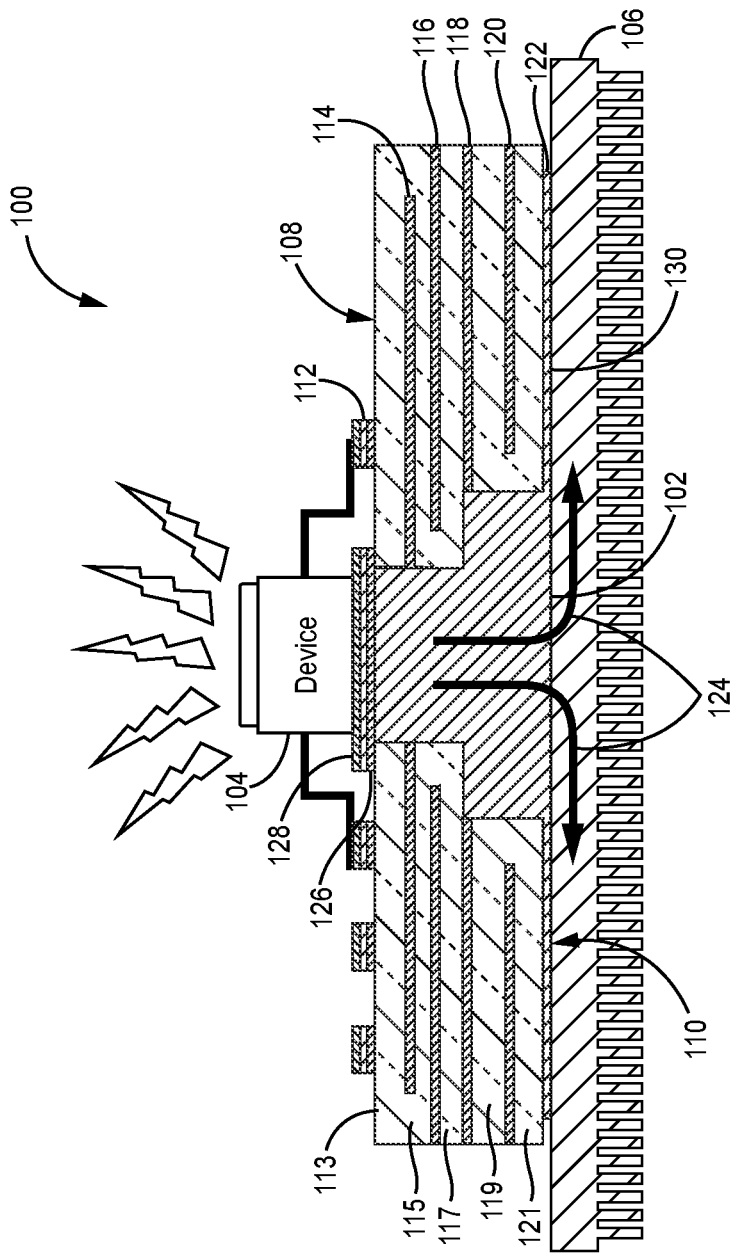
FIG. 1 is a vertical cross-sectional view of an example PCB having a customized thermal pathway.

FIG. 1 is a vertical cross-sectional view of a PCB 100 having a customized thermal pathway 102 to transfer heat from a component 104 on a front side 108 of the PCB 100 to a heat sink 106 on a backside 110 of the PCB 100. The PCB 100 includes a plurality of conductive layers 112, 114, 116, 118, 120, 122 and a plurality of non-conductive layers 113, 115, 117, 119, 121 forming a laminated stack. Each conductive layer 112, 114, 116, 118, 120, 122 is composed of an electrically conductive material, typically copper, and patterned to form electrically conductive interconnects. The conductive layers 112, 114, 116, 118, 120, 122 are separated by a respective insulating (non-conductive) layer 113, 115, 117, 119, 121. It is noted that the number of non-conductive layers and conductive layers shown in FIG. 1 is merely a design choice and that fewer or greater numbers of non-conductive layers and conductive layers can be used.

Each non-conductive layer 113, 115, 117, 119, 121 is made of a non-conductive material. The PCB 100 of FIG. 1 is shown after final lamination, so each non-conductive layer 113, 115, 117, 119, 121 is composed of a fully cured resin. Prior to lamination, the non-conductive material of the non-conductive layers 113, 115, 117, 119, 121 can be a prepreg or a base material. Prepreg is a fibrous reinforcement material impregnated or coated with a resin binder and consolidated and partially cured to an intermediate semi-solid product. The resin in prepreg is only partially cured and therefore flows during lamination. After being sufficiently heated during a lamination process, the resin in prepreg cools into a fully cured state. Base material is composed of a fully cured resin and as such does not flow during lamination. Each layer of non-conductive material 113, 115, 117, 119, 121 can be the same type/grade of material or one or more layers can be of a different type/grade. For example, one or more non-conductive layers proximate the front side 108 can be composed of a resin designed to support required frequencies for the component 104 mounted on the front side 108.

The PCB 100 defines a front side 108 and a backside 110. The front side 108 is an exposed face of the PCB 100 that can function as the primary surface on which one or more components are mounted to the PCB. The front side 108 can define one or more bond pads or the like onto which the one or more components can be mounted, such as one or more bare dies, packaged ICs, heat sinks, or electrical connectors. The backside 110 is an exposed face of the PCB 100 that is reverse of the front side 108. The backside 110 of the PCB 100 can be mounted to a heat sink, cool ribbon or other heat removal structure.

The thermal pathway 102 extends through all layers of the PCB 100 from the front side 108 to the back side 110 thereof. The thermal pathway 102 is composed of a thermally conductive material, for example a metal such as copper. The one or more heat generating components 104 are mounted on the front side 108 of the PCB 100 and are thermally coupled to the thermal pathway 102. The component(s) 104 can be any device that generates heat such as a die or packaged component having an integrated circuit or discrete device therein. In this example, the thermal pathway 102 has a large horizontal cross-section and the component 104 is mounted on a surface of the thermal pathway 102 on the front side 108. As used herein a "horizontal" cross-section is a cross-section taken in parallel with the conductive and non-conductive layer(s) of a PCB, material sheet, or laminated stack. A "vertical" cross-section as used herein is a cross-section taken normal to a PCB, material sheet, or laminated stack.

A bond pad 126 can be defined by the outer conductive layer 112 on the front side 108 of the PCB 110 overtop of the surface of the thermal pathway 102 that is proximate the front side 108 of the PCB 100. One or more components 104 can be mounted to the bond pad 126. A thermally conductive adhesive 128 can be used to adhere the component 104 to the bond pad 126, such that the component 104 is thermally coupled to the thermal pathway 102. In another example, the bond pad 126 can be recessed, such that it is defined in an internal conductive layer (e.g., layer 114). In such an example, a cavity can be defined in the front side 108 of the PCB 108 to expose the bond bad and the thermal pathway can extend from the bond pad to the back side 110 of the PCB 100.

The heat sink 106 can be mounted to the backside 110 of the PCB 100 and thermally coupled to the thermal pathway 102 at the back side 110 such that the thermal pathway 102 provides a path for heat to travel from the one or more components 104 through the PCB 100 to the heat sink 106. The heat sink 106 can be thermally coupled to the thermal pathway 102 with a thermally conductive adhesive 130.

Advantageously, the thermal pathway 102 can be customized to provide efficient and effective heat transfer from the one or more components 104 to the heat sink 106. In this example, the thermal pathway 102 has a larger horizontal cross-section proximate the back side 110 as compared to its horizontal cross-section proximate the front side 108. Increasing the horizontal cross-section in this way can allow heat from the component 102 to spread easier across the heat sink 106 without taking up the same horizontal cross-sectional area in the PCB layers proximate the front side 108. Arrows 124 illustrate the general flow of heat through the thermal pathway 102. Other shapes and configurations of customized thermal pathways can also be made as are described below, for example, with reference to FIG. 11.

For illustrative purposes, FIG. 1 is a simplified version of a PCB. In other examples, the PCB can have more than conductive layers and more than one customized thermal pathway. The PCB can also include other features such as vias electrically coupling different conductive layers of the PCB.

Figure 2:
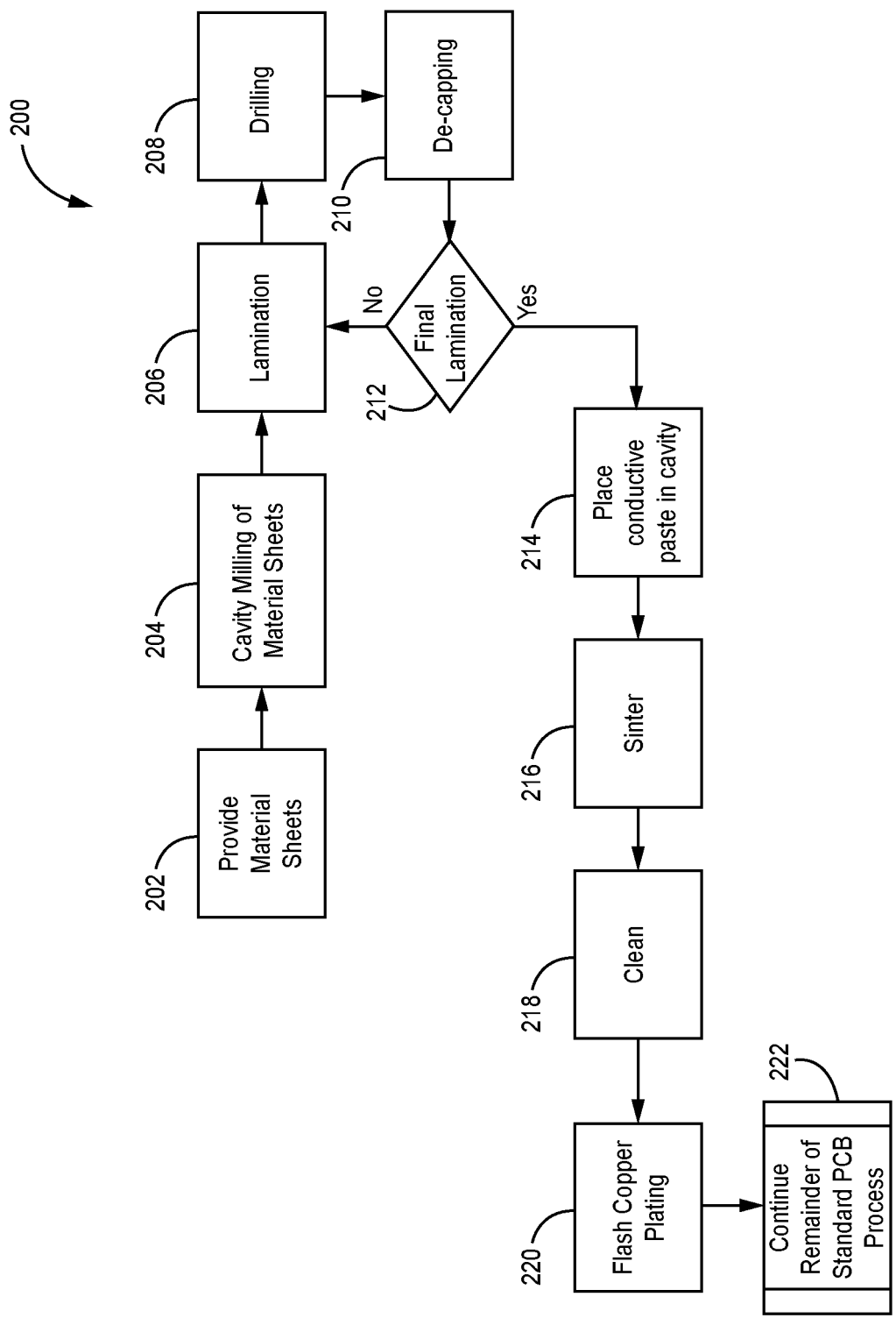
FIG. 2 is a flow diagram of an example process for creating a customized thermal pathway in a PCB.
Figure 3:
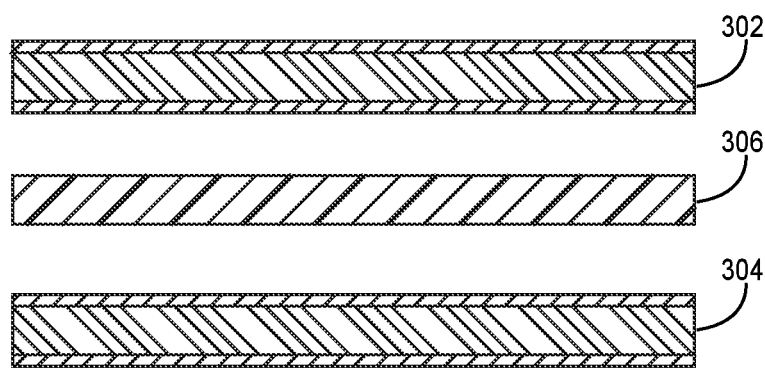
FIG. 3 is a vertical cross-sectional view of example material sheets that can be used in the process of FIG. 2.

FIG. 2 is a flow diagram of a method 200 for creating a customized thermal pathway in a PCB. At block 202, material sheets for stacking and forming a PCB can be provided, such as one or more sub-lams and one or more sheets of prepreg. FIG. 3 is a vertical cross-sectional view of some example material sheets showing a first sub-lam 302, a second sub-lam 304, and a sheet of prepreg 306. In an example, the first sub-lam 302 and the second sub-lam 304 are rigid. Each sub-lam 302, 304 can include one or more layers of conductive material separated by one or more layers of non-conductive material in the form of fully cured resin. In the example shown in FIG. 3, the first sub-lam 302 and the second sub-lam 304 are a core comprising a single layer of fully cured resin (e.g., base material) having a conductive layer on each side. In other examples, one or more of the sub-lams 302, 304 can have only a single conductive layer or can have more than two conductive layers laminated together with respective fully cured non-conductive layers therebetween. The sheet(s) of prepreg 306 can be composed of partially cured resin as discussed above. In other examples different numbers of material sheets (e.g., different numbers of sub-lams, prepreg, etc.) or different/additional types of material sheets, such as RF material or flexible or partially flexible sub-lams, can be used.

Figure 4:
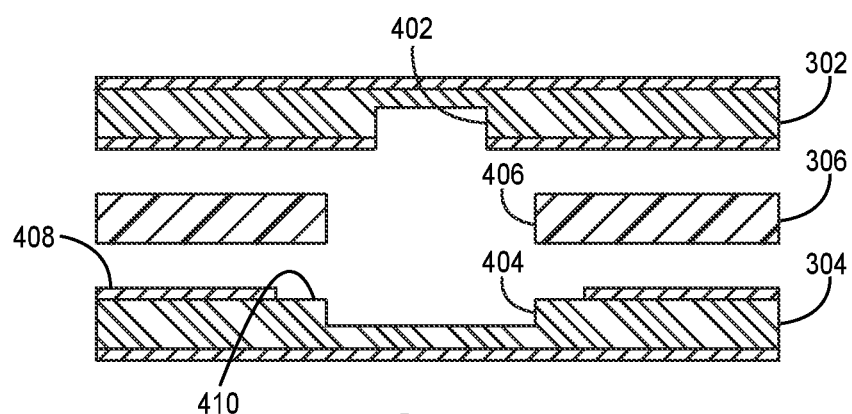
FIG. 4 is a vertical cross-sectional view of example cavities formed in the sheets of FIG. 3.

At block 204, cavities are formed in one or more of the material sheets. FIG. 4 is a vertical cross-sectional view of the first sub-lam 302, the second sub-lam 304, and the prepreg sheet 306 showing example cavities 402, 404, 406 formed therein. Cavities 402, 404, 406 can be formed in each of the material sheets, which in this example includes the first sub-lam 302, the second sub-lam 304, and the sheet of prepreg 306. Because the material sheets 302, 304, 306 are not yet adhered together, each sheet 302, 304, 306 can be processed independently to form its cavity 402, 404, 406. For example, a first machining process can be used to form the first cavity 402 in the first sub-lam 302, a second machining process can be used to form the second cavity 404 in the second sub-lam 304, and a third machining process can be used to form the third cavity 406 in the sheet of prepreg 306. The cavities 402, 404, 406 can be formed in any appropriate manner including milling, cutting, or other machining. Because the cavities 402, 404, 406 are formed independently of one another, it is straightforward to form each cavity having a distinct shape and/or cross-section if desired. As shown in FIG. 4, the cavity 402 in the first sub-lam 302 has a smaller cross-section than the cavities 404, 406 in the second sub-lam 304 or the sheet of prepreg 306. The varied shapes and/or cross-sections of the different cavities can be used to form customized thermal pathways having non-uniform geometries along the vertical cross-section as described herein.

One or more of the cavities 402, 404 in one or more of the sub-lams 302, 304 can be formed only partially therethrough, such that one or more layers of base material in the sub-lam 302, 304 remain intact across the cavity 402, 404. That is, the cavity 402, 404 extends into the sub-lam, but does not extend all the way through the sub-lam from one side to the other. The cavity 402 in the first sub-lam 302 and the cavity 404 in the second sub-lam 304 are examples of such a cavity extending partially through a sub-lam. Cavities in a prepreg sheet can be formed entirely through the prepreg sheet. Cavity 406 is an example of a cavity extending entirely through the prepreg sheet 306. In an example, partial cavities are formed in sub-lams 302, 304 that are to be disposed on the outside (e.g., top or bottom) of a stack to be laminated. That is, partial cavities are not formed in sub-lams 302, 304 or other material sheets (e.g., prepreg) that are to be disposed internal to a stack while that stack is being laminated. Although only a single cavity 402, 404, 406 is shown in each material sheet 302, 304, 306, in other examples, additional cavities can be formed in any of the material sheets 402, 404, 406.303, 304, 306. FIGS. 15A-G below illustrate an example in which an additional cavity is formed in the material sheet 302.

One or more layers of conductive material can be removed adjacent the cavity of the corresponding material sheet to isolate the conductive material from the thermal pathway that will be formed in the cavity. In the example shown in FIG. 4, a portion 410 of conductive layer 408 is removed adjacent cavity 404 to isolate the conductive layer 408. In other examples, other portions of other conductive layers can be removed in addition to or instead of the portion 410 shown. For example, both sides of a particular conductive layer can, but need not be removed adjacent a cavity.

Although FIGS. 3 and 4 illustrate the first sub-lam 302, the second sub-lam 304, and the sheet of prepreg 306 being disposed in a generally vertically-aligned spaced-apart relationship, this is merely for illustrative purposes. In practice, the first sub-lam 302, the second sub-lam 304, and the sheet of prepreg 306 are processed independently of one another at block 202 and block 204, such that the first sub-lam 302, the second sub-lam 304, and the sheet of prepreg 306 need not have any particular physical relationship with one another.

Figure 5:
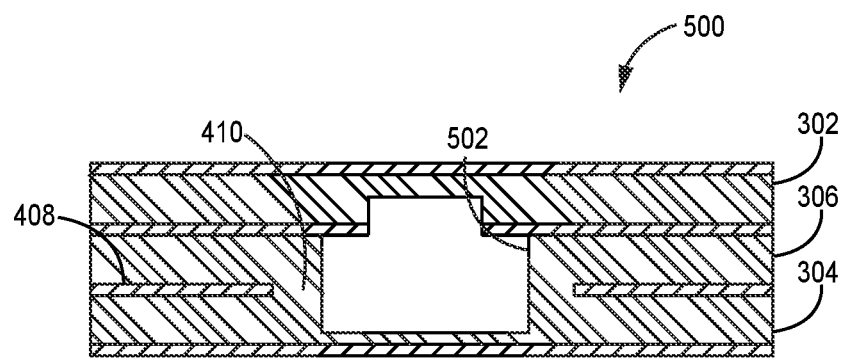
FIG. 5 is a vertical cross-sectional view of an example laminated stack formed from the sheets of FIG. 4.

At block 206, the material sheets having cavities therein are stacked and laminated to form a laminated stack. FIG. 5 is a vertical cross-sectional view of the first sub-lam 302, the second sub-lam 304, and the prepreg sheet 306 stacked and laminated to form a laminated stack 500. The material sheets can be stacked in the order desired for the laminated stack. Prepreg sheets (306) can be disposed between sub-lams (302, 304) to adhere the sub-lams (302, 304) together. The material sheets can be aligned such that cavities in the sub-lams (302, 304) are aligned with corresponding cavities in the prepreg sheets 306. The sub-lams (302, 304) can also be oriented such that the partial cavities in the sub-lams (302, 304) open towards the corresponding cavities in the prepreg sheet (306) between the sub-lams. In any case, corresponding cavities in the material sheets (e.g., sub-lams (302, 304) and prepreg sheet(s) 306) are disposed to communicate with one another to form one or more composite cavities. That is, one or more larger composite cavities are formed from the combination of multiple cavities in adjacent material sheets. In the example of FIG. 5, the first sub-lam 302, the second sub-lam 304, and the prepreg sheet 306 are stacked and aligned such that the first partial cavity 402, the second partial cavity 404, and the third cavity 406 are aligned. The prepreg sheet 306 is disposed between the first sub-lam 302 and the second sub-lam 304, and the first sub-lam 302 and the second sub-lam 304 are oriented such that the first partial cavity 402 and the second partial cavity 404 open towards and communicate with the third cavity 406 forming a composite cavity 502 from all three cavities 402, 404, 406.

Once the material sheets are stacked and aligned, the stack is laminated to cure the prepreg sheets and form the laminated stack 500. Any suitable lamination temperature and pressure can be used. Advantageously, the partial cavities 402, 404 in the first sub-lam 302 and the second sub-lam 304 leave some of the base material intact across the cavities 402, 404 which provides stability for the sub-lams 302, 304. This can be particularly advantageous for cavities with larger horizontal cross-sections, which would have a bigger effect on the stability of the sub-lam 302, 304. In an example, a laminate block as described in U.S. Pat. No. 11,317,521, entitled "RESIN FLOW RESTRICTION PROCESS AND STRUCTURE", which is hereby incorporated herein by reference, can be used to reduce flow of prepreg into the composite cavity during lamination. Prepreg from the sheet of prepreg 306 can flow to fill in the space provided by removed portion 410 of conductive layer 408 to provide non-conductive isolations of the conductive layer 408 from the composite cavity 502.

In this example, the cavity 404 in the second sub-lam 304 and the sheet of prepreg 306 has a different (larger) horizontal cross-section than the cavity 402 in the first sub-lam 302. The method 200 described herein, enables such customizations to be made, because different material sheets are individually milled to form cavities therein. Thus, the cavities in each material sheet can have independent positions, shapes, and sizes as compared to cavities in other material sheets. In the example shown in FIGS. 3-5 a single composite cavity 502 that increases in horizontal cross-section is shown, however, in other examples multiple cavities and/or cavities with more complex shapes can be created.

Figure 6:
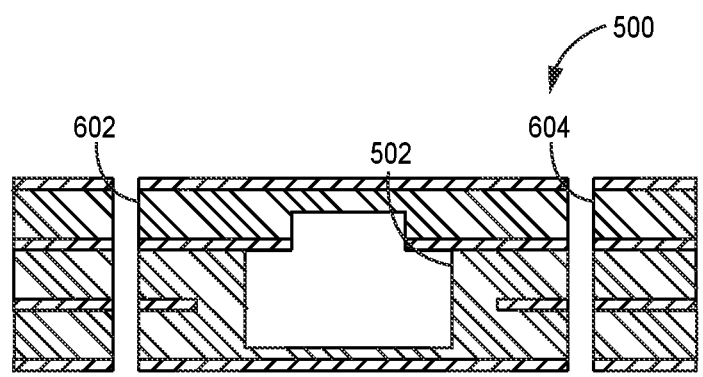
FIG. 6 is a vertical cross-sectional view of example holes drilled in the laminated stack of FIG. 5.

At block 208, the laminated stack 500 can be drilled to create holes for electrical interconnects (vias) between conductive layers of the laminated stack. Any suitable technique for drilling the holes can be used. FIG. 6 is a vertical cross-sectional view of the laminated stack 500 showing two holes 602, 604 drilled therein. Although the example holes 602, 604 of FIG. 6 extend entirely through the laminated stack 500, in other examples, one or more holes can extend partially through the stack 500. Additionally, more than two vias can be included in the laminated stack 500.

Figure 7A:
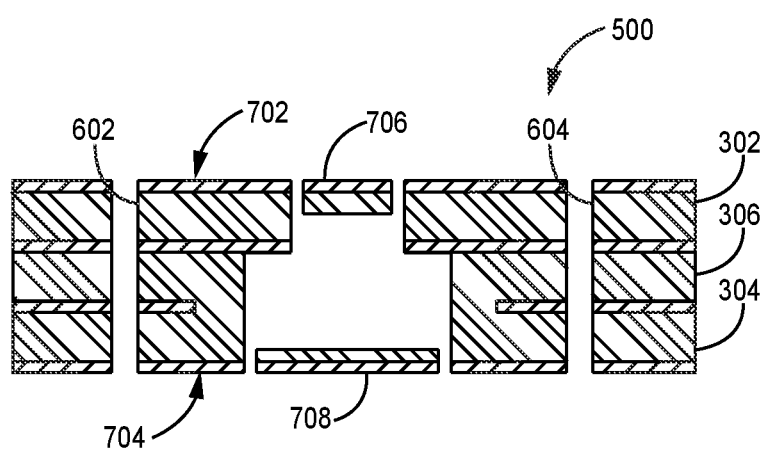
FIGS. 7A and 7B are vertical cross-sectional views of an example de-capping of the laminated stack of FIG. 6.
Figure 7B:
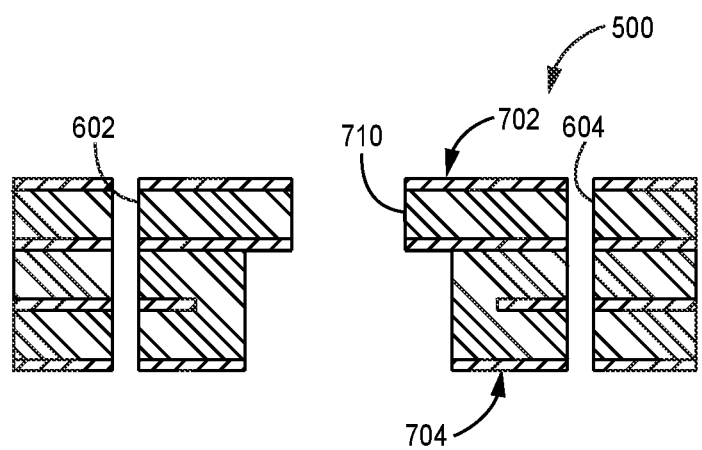

At block 210, the partial cavities formed in the sub-lams (302, 304) can be de-capped to remove portions of the sub-lams that were left covering the cavities. FIGS. 7A and 7B are vertical cross-sectional views of the laminated stack 500 showing an example de-capping step. De-capping removes all or a portion of the sub-lam that was left during the partial cavity forming at block 204. This removal exposes the cavities in the sub-lam and therefore any composite cavity of which those cavities are a part. In the example of FIGS. 7A and 7B, de-capping removes one or more portions 706 of the first sub-lam 302 covering the first cavity 402 and one or more portions 708 of the second sub-lam 304 covering the second cavity 404, thereby exposing the first cavity 402 to a first side 702 of the laminated stack 500 and exposing the second cavity 404 to the second side 704 of the laminated stack 500, which also exposes the composite cavity 502 to the first side 702 and the second side 704 of the laminated stack 500. FIG. 7A shows the portions 706, 708 of the first sub-lam 302 and the second sub-lam 304 that are removed during de-capping. FIG. 7B shows the resulting exposed composite cavity 710 exposed to the first side 702 and the second side 704 of the laminated stack 500.

In the example shown in FIGS. 7A and 7B, the portion of the first sub-lam 302 that is removed during de-capping has the same horizontal cross-section as the partial cavity 402 in the first sub-lam 302 and the portion of the second sub-lam 304 that is removed during de-capping has the same horizontal cross-section as the partial cavity 404 in the second sub-lam 304. Thus, the entire exposed cavity 710 formed as a result of de-capping has a consistent horizontal cross-section through the first sub-lam 302 and a consistent horizontal cross-section through the second sub-lam 304. While the horizontal cross-sections within the respective sub-lams 302, 304 are consistent, the horizontal cross-section of the cavity in the second sub-lam 304 can be the same or different in size or shape to the horizontal cross-section of the cavity in the first sub-lam 302. In other examples, the one or more portions of the sub-lam that are de-capped have a different (e.g., smaller) horizontal cross-section than the horizontal cross-section of the corresponding partial cavity in that sub-lam.

Although in the example described herein both sides of the composite cavity are de-capped, in other examples only a single side (e.g., the second side 704) of the laminated stack 500 is de-capped and the other side (e.g., the first side 702) is left intact, such that the corresponding composite cavity is unopened to the first side 702. In other examples, a composite cavity that opens to only one side of the laminated stack 500 can be formed by not creating a cavity in one or more of the sub-lams (e.g., the first sub-lam 302) in the corresponding location of other cavities, such that the resulting composite cavity stops at the sub-lam (e.g., the first sub-lam 302) that does not have a cavity therein. One side may be left intact (i.e., not de-capped) if the laminated stack 500 is to be used as a sub-lam which will be subsequently laminated to another material sheet (e.g., another sub-lam). In such an example, leaving one side of the composite cavity covered creates a partial cavity in the resulting sub-lam that can be de-capped after a subsequent lamination of the sub-lam. Such a process can be used to form the sub-lams 302, 304 discussed above. Example processes in which the laminated stack 500 is used as a sub-lam for further lamination cycles is described below with reference to FIGS. 10 and 16A-E.

Figure 8:
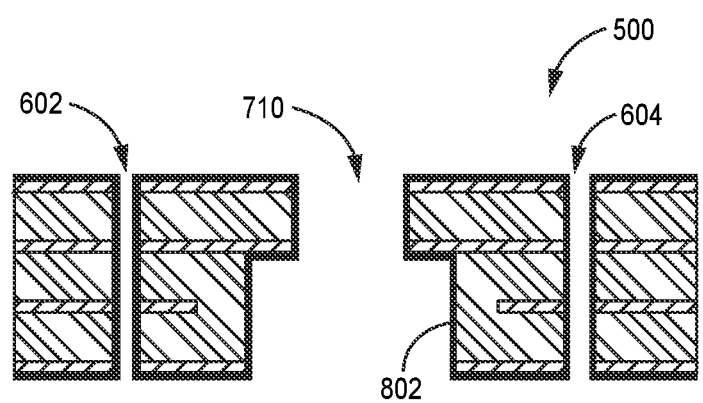
FIG. 8 is a vertical cross-sectional view of example plating on the laminated stack of FIG. 7B.
Figure 9A:
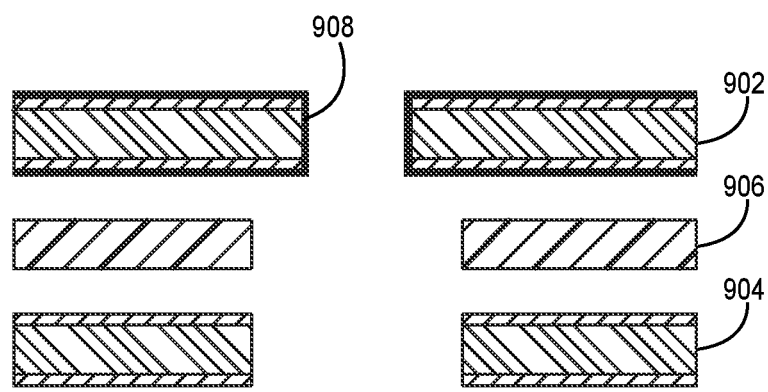
FIG. 9A is a vertical cross-sectional view of other example material sheets that can be used in the process of FIG. 2.
Figure 9B:
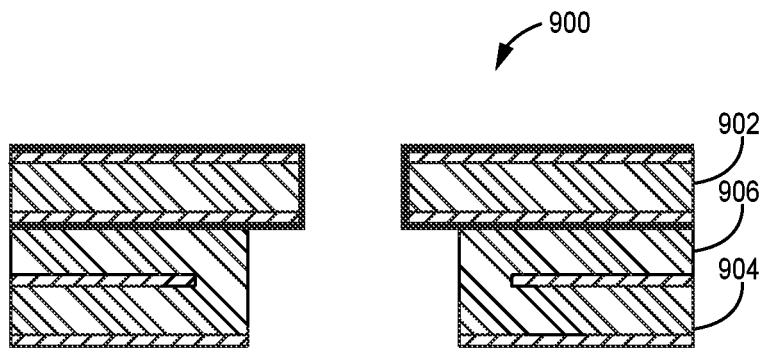
FIG. 9B is a vertical cross-sectional view of the material sheets of FIG. 9A in a laminated stack.

Plating (e.g., with copper) can occur at one more times during the process 200 of creating a laminated stack. For example, FIG. 8 is a vertical cross-sectional view of the laminated stack 500 showing plating 802 on the holes 602, 604 and the cavity 710. The holes 602, 604, and cavity 710 can be plated after de-capping (block 210) to plate the internal surfaces of the composite cavity 710, the holes 602, 604, and the external surfaces of the laminated stack 500. FIGS. 9A and 9B are vertical cross-sectional views of example material sheets 902, 904, 906 prior to lamination and a resulting laminated stack 900 formed therefrom in accordance with blocks 202-210 described herein. In this example a first sub-lam 902 is plated with metal 908 prior to lamination while a second sub-lam 904 and a sheet of prepreg remain unplated. After lamination to upper layers of the laminated stack 900 are plated while the lower layers remain unplated. In a particular example, the outer conductive layer on the side on which RF components are to be mounted is electrically coupled in this way to the adjacent inner layer closest to the outer conductive layer, while other conductive layers remain electrically isolated from one another in the composite cavity. In yet other examples, a laminated stack can be plated after laminated, but prior to de-capping to plate the internal surfaces of any holes without plating the internal surfaces of the composite cavity. Any suitable plating technique can be used, including electroless plating and/or electrolytic plating, and any suitable metal can be used, including one or more of copper, nickel, and gold.

Figure 10:
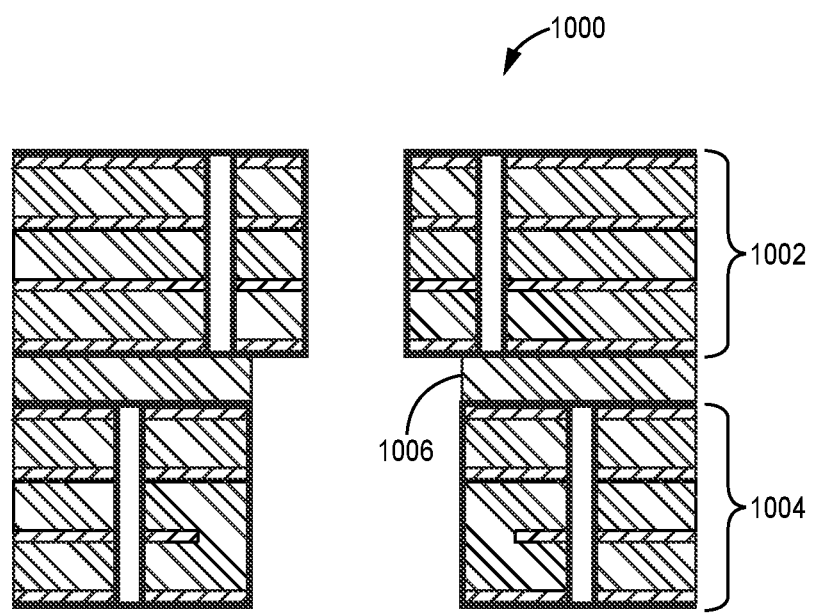
FIG. 10 is a vertical cross-sectional view of an example laminated stack formed from two sub-lams.
Figure 16A:
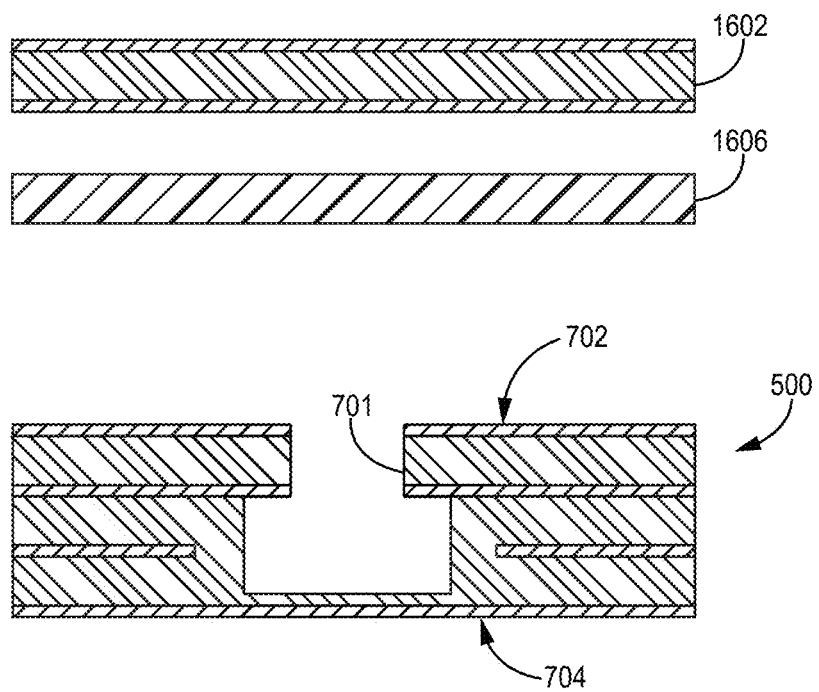
Figure 16B:
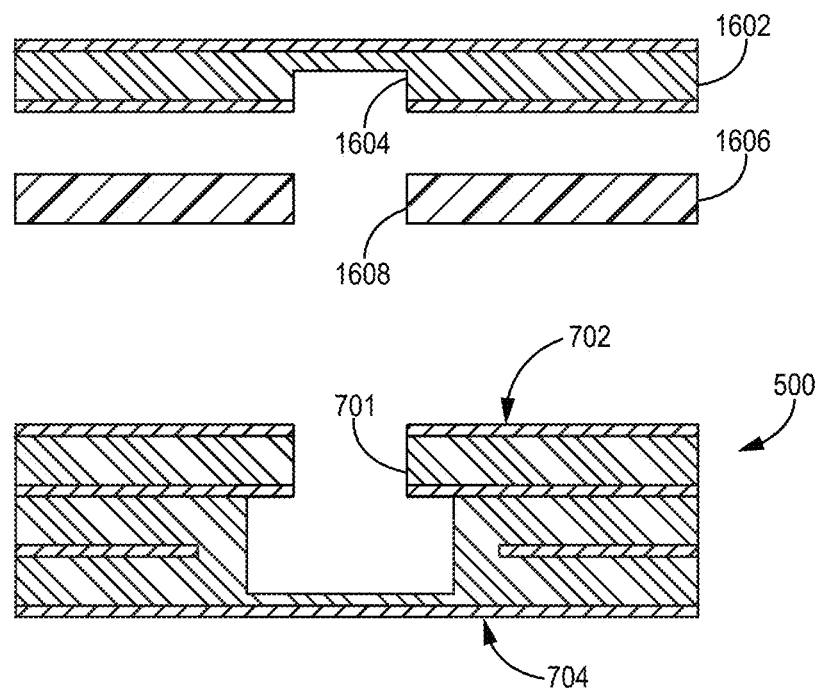
Figure 16C:
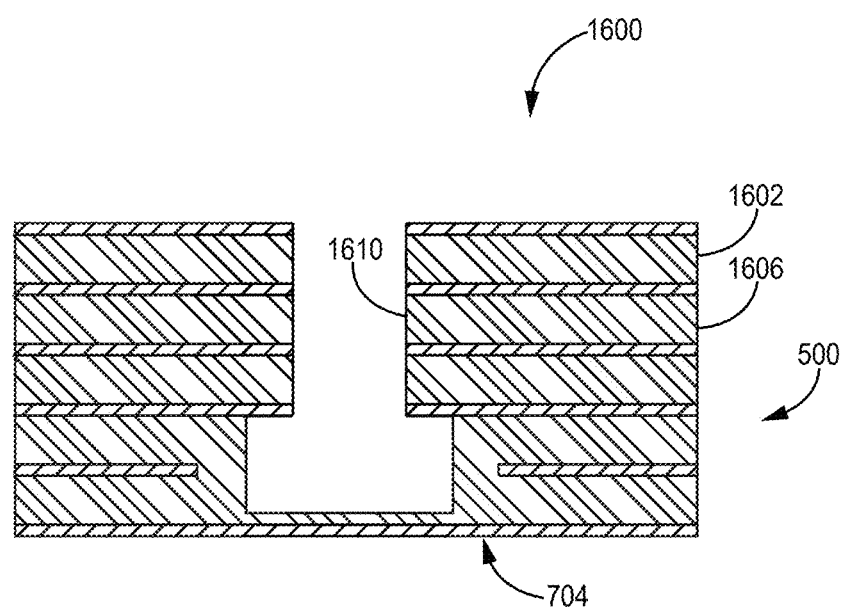
Figure 16D:
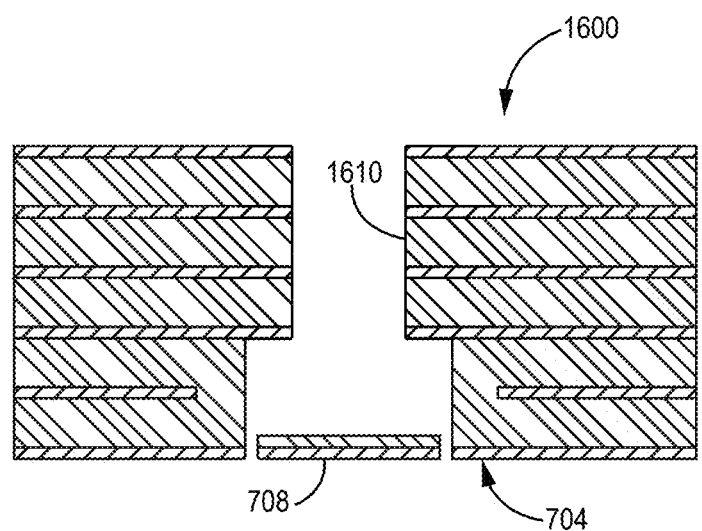
Figure 16E:
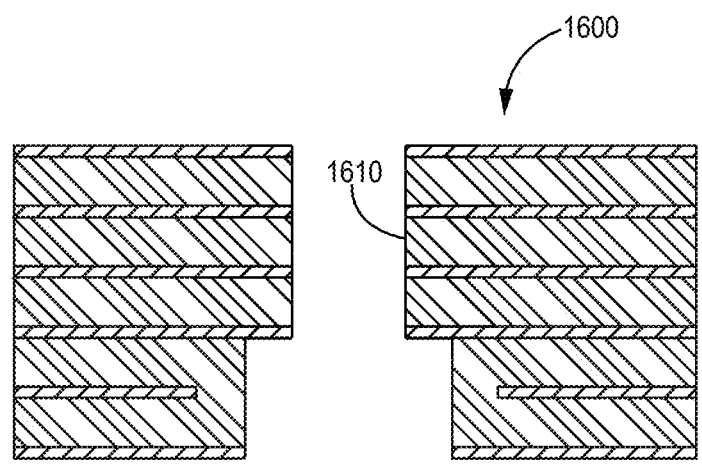

At block 212, if additional material sheets are to be added to the laminated stack, the method can return to block 202 to provide the additional material sheets (e.g., sub-lams, sheets of prepreg), form cavities in the additional material sheets (block 204), and stack and laminate the additional material sheets to the existing laminated stack (block 206). FIG. 16A is a vertical cross-sectional view of an example stage in which an additional material sheet 1602 is added to the laminated stack 500 created as described in FIGS. 3-7B. In the example shown in FIG. 16A, only the first side 702 of the laminated stack 500 is de-capped prior to addition of the material sheet 1602. The second side 704 is not de-capped until after lamination of the material sheet 1602. Accordingly, the composite cavity 1610 is open to the first side 702, but not the second side 704. Additionally, no holes have been drilled in stack 500, although in other examples, holes are drilled prior to adding additional material sheets. As shown in FIG. 16A, the additional material sheet 1602 is to be added to the first side 702 of sub-lam 500 with prepreg layer 1606 therebetween. Material sheet 1602 is a third sub-lam, the same as sub-lam 302 above, and prepreg 1606 is the same as prepreg 306 described above, both with respect to FIG. 3. Referring to FIG. 16B, a cavity 1604 is formed in the third sub-lam 1602, which can be formed in the manner described for cavity 402 in sub-lam 302 with respect to FIG. 4. A cavity 1608 can also be formed in the prepreg 1606 in the manner described for cavity 606 in prepreg 306 with respect to FIG. 4. Referring to 16C, the material sheets 1602, 1606 having cavities therein are stacked along with the sub-lam 500 and laminated to form a laminated stack that includes sub-lam 1602, prepreg 1606, and sub-lam 500 in the manner described with respect to FIG. 5. The material sheets 1602, 1606, 500 are disposed such that the cavities 1604, 1608, 701 communicate with one another to form a composite cavity 1610. The newly formed laminated stack 1600 can have additional holes drilled and plated (block 208). The laminated stack can then be de-capped (block 210) by removing portion 710 as shown in FIG. 16D-E and plated (block 212) if desired. Plating can occur at appropriate times as described above. FIG. 10 is a vertical cross-sectional view of another example laminated stack 1000 formed from two sub-lams 1002, 1004, wherein each sub-lam 1002, 1004 was formed via blocks 202-210 as described herein. One or more additional sheets of prepreg 1006 can be used to laminated the sub-lams 1002, 1004 together as described above. This cycle of adding layers to the laminated stack can occur as many times as desired to obtain the desired number of layers on the laminated stack.

Figure 11:
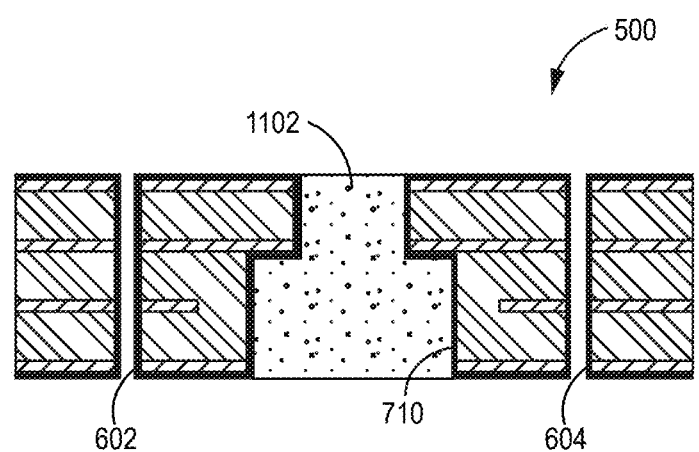
FIG. 11 is a vertical cross-sectional view of example conductive paste in the laminated stack of FIG. 8.

At block 214, conductive paste can be placed into the composite cavities that are to be used as thermal pathways of the laminated stack. FIG. 11 is a vertical cross-sectional view of the laminated stack 500 showing conductive paste 1102 in the cavity 710.

Any suitable technique for placing the paste in the cavity 710 can be used, including screen printing, inkjet printing, and spraying. Example techniques for placing the paste in the one or more cavities are described in U.S. Pat. No. 9,565,748, entitled "Nano-copper solder for filling thermal vias", which is hereby incorporated herein by reference.

In an example, the conductive paste 1102 includes metal nano-particles and is configured such that the metal nano-particles can fuse together during a sintering process to create a substantially metal thermal pathway. In an example, the conductive paste 1102 is configured to create a thermal pathway that is at least 90% metal. To create such a thermal pathway that is substantially metal, the conductive paste can be comprised of at least 90% metal micro and nano-particles along with a suitable surfactant to restrict fusing of the micro and nano-particles until sintering. By using a conductive paste that results in a substantially entirely metal thermal pathway, the thermal conductivity of the thermal pathway is increased as compared to conductive pastes with epoxy, which has a generally lower thermal conductivity than metal. In a particular example, the metal micro and nano-particles are copper. The term "paste" is used herein includes pastes, sprays, inks, and other forms of conductive formulation configured to be placed into a cavity and sintered. United States Patent Application No. 2021/0320078, entitled "ELECTRONICS ASSEMBLIES EMPLOYING COPPER IN MULTIPLE LOCATIONS", which is hereby incorporated herein by reference, describes example metal nano-particle pastes that are suitable for use as the conductive paste 1102 herein.

Using a conductive paste instead of a solid coin to create a thermal pathway can make it easier to have customized thermal pathways with complex and varied horizontal cross-sections. If a solid coin where to be used for a complex shape, the solid coin would need to be machined or otherwise formed into the complex shape and the corresponding cavity would also need to be machined into a matching shape with a corresponding size and geometry. Precisely matching the cavity and the solid coin is difficult to do, even for basic cylindrical shapes. This is typically addressed by forming the cavity larger to account for tolerance errors in the size and geometry of the cavity/coin. A conductive paste, however, naturally forms to the size and geometry of the cavity. Thus, the cavity does not need to be made larger to account for tolerance errors. Additionally, the conductive paste can flow into elongated portions of cavities that may be difficult to position a solid coin into. This can enable thermal pathways with optimum surface footprints, profiling, and/or geometries. For example, a thermal pathway can include one or more changes of direction in an internal portion of the laminated stack to avoid an internal structure of the stack, such as a trace on an internal conductive layer.

Figure 12:
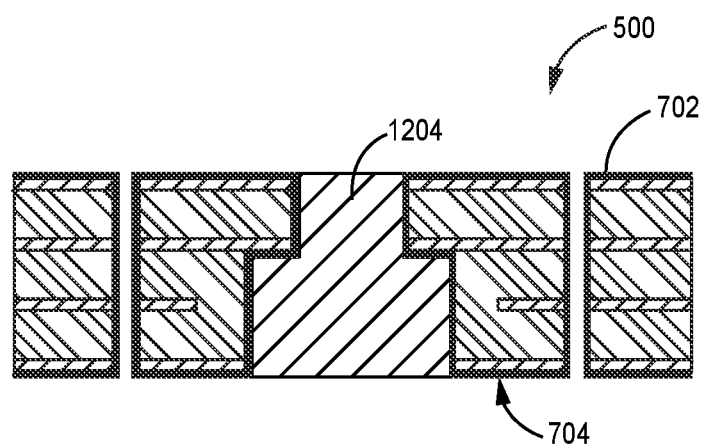
FIG. 12 is a vertical cross-sectional view of the laminated stack of FIG. 11 with the conductive paste solidified.

At block 216, once the conductive paste 1102 is inserted into the one or more cavities of the laminated stack 500, the paste 1102 can be cured or sintered to solidify the paste and form the solid thermal pathway. FIG. 12 is a vertical cross-sectional view of the laminated stack 500 wherein the conductive paste has been solidified forming a thermal pathway 1204. With suitable conductive paste, the thermal pathway 1204 can be at least 90% metal (e.g., copper) as described above. In some examples, additional conductive paste can be added on top of the solidified thermal pathway 1204 after initial sintering to fill dimples on the exposed surface if desired and needed. The additional conductive paste can then be sintered to solidify it and combine it with the solidified thermal pathway 1204 formed in the initial sintering.

Figure 13:
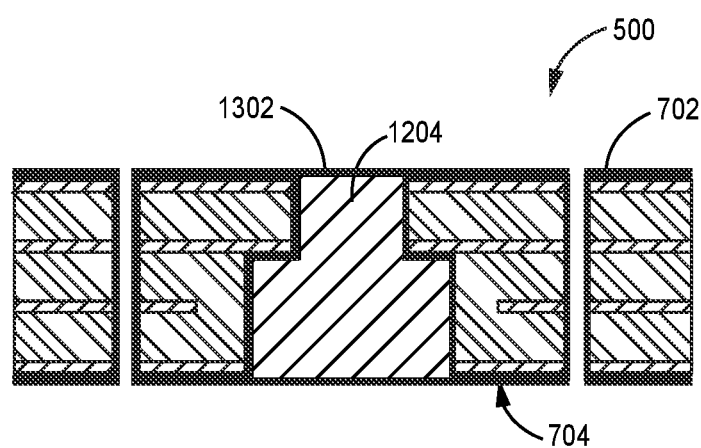
FIG. 13 is a vertical cross-sectional view of the laminated stack of FIG. 12 with plating on the top and bottom.

At blocks 218 and 220, the exposed surfaces of a solid thermal pathway can be cleaned and plated (e.g., copper plating). FIG. 13 is a vertical cross-sectional view of the laminated stack 500 showing plating 1302 on the first side 702 and the second side 704 of the laminated stack 500 over the exposed surfaces of a solid thermal pathway 1204. In other examples, the exposed surfaces of the solid thermal pathway 1204 can be left without a finish.

The laminated stack of FIG. 13 can be used as a finished PCB or additional processing can be performed (block 222). Components can be mounted on the first side 702 and thermally coupled to desired thermal pathways (1204) of the PCB. One or more heat sinks can be mounted to the second side 704 and thermally coupled to the thermal pathways (1204). Any suitable technique for attaching and thermally coupling the components and heat sink(s) can be used. At block 222, other processing steps before, during, or after the method 200 described herein can be performed as known to those skilled in the art.

Figure 14:
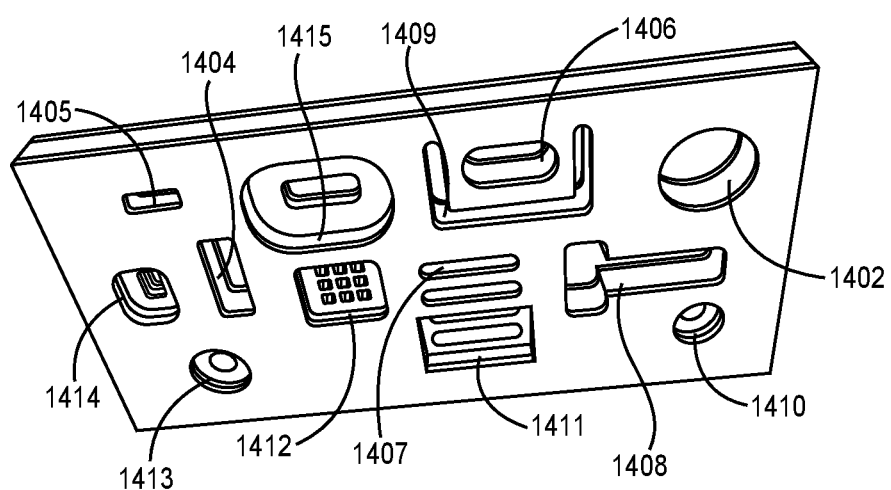
FIG. 14 is a top view of an example PCB having customized cavity shapes therein.

FIG. 14 is a top view of an example PCB 1400 showing example shapes of cavities that can be created, filled with conductive paste, and formed into customized thermal pathways using method 200. In addition to a cylindrical shape like cavities 1402, non-circular shapes like cavities 1404-

1407 can be formed. Horizontal cross-sectional shapes having one or more arms can also be formed as shown in cavities 1408 and 1409. Additionally, cavities can be nested inside regions formed by other cavities, like cavity 1406 within cavity 1409. Elongated horizontal cross-sections like cavity 1407 can be more easily formed. Also, cavities with varied horizontal cross-sections along their (vertical) height, like that of cavities 1410-1415 can be formed, where the cavities have a different horizontal cross-section at different heights in the PCB. Cavity 1414 is an example cavity having more than two different cross-sectional shapes/sizes along its vertical height. Cavity 1412 is an example cavity formed by removing multiple smaller portions during de-capping such than an underlying larger cavity communicated to a side via multiple smaller apertures. As can be understood, method 200 can be used to create thermal pathways having many different customized shapes and geometries in both the vertical and horizontal direction.

Figure 15A:
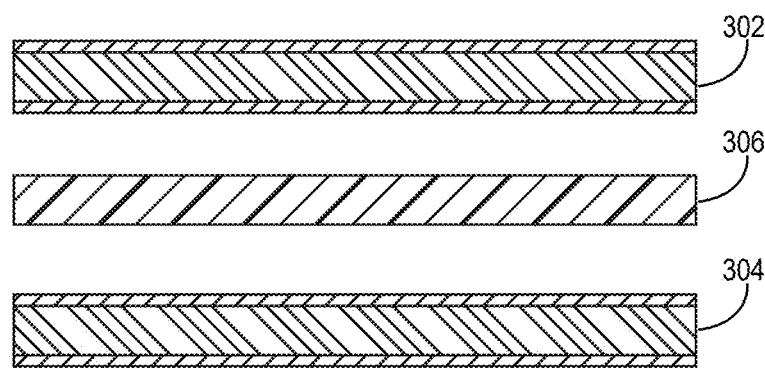
Figure 15B:
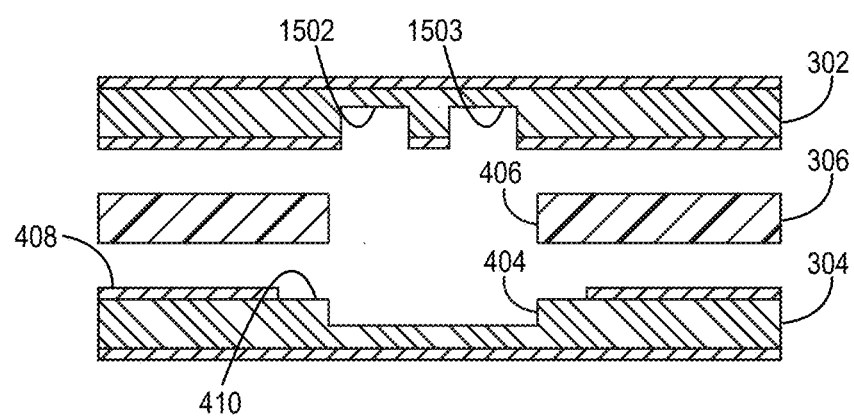
Figure 15C:
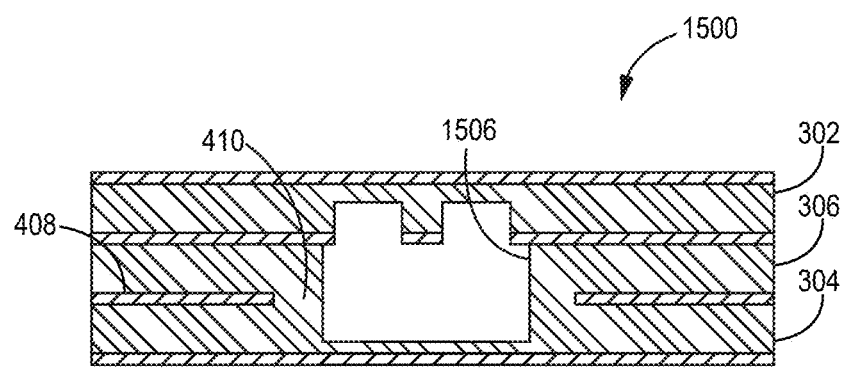

FIGS. 15A-G are vertical cross-sectional views of example stages in creating another customized thermal pathway with multiple cavities formed in the first material sheet 302. FIG. 15A illustrates three example material sheets 302, 304, 306, which are the same described with respect to FIG. 3. Referring to FIG. 15B, two cavities 1502, 1503 are formed in the first sub-lam 302, which can be formed in the manner described for cavity 402 with respect to FIG. 4. Cavities 404, 406 are also formed in the second sub-lam 304 and prepreg 306 in the manner described with respect to FIG. 4. Referring to 15C, the material sheets 302, 304, 306 having cavities therein are stacked and laminated to form a laminated stack 1500 in the manner described with respect to FIG. 5. The material sheets 304, 304, 306 are disposed such that the four cavities 1502, 1504, 404, 406 communicate with one another to form a composite cavity 1506.

Figure 15D:
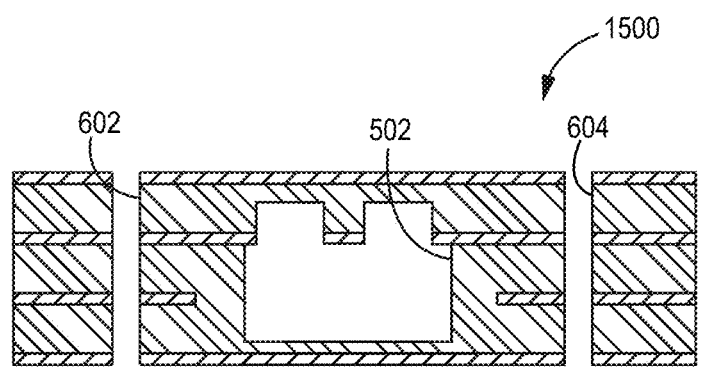
Figure 15E:
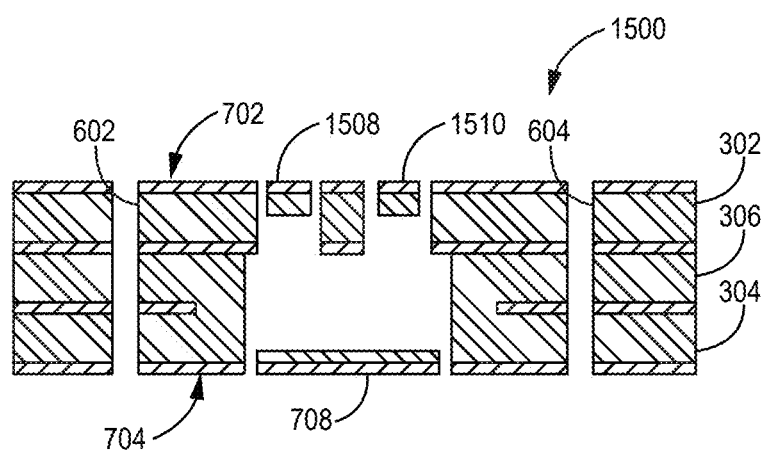
Figure 15F:
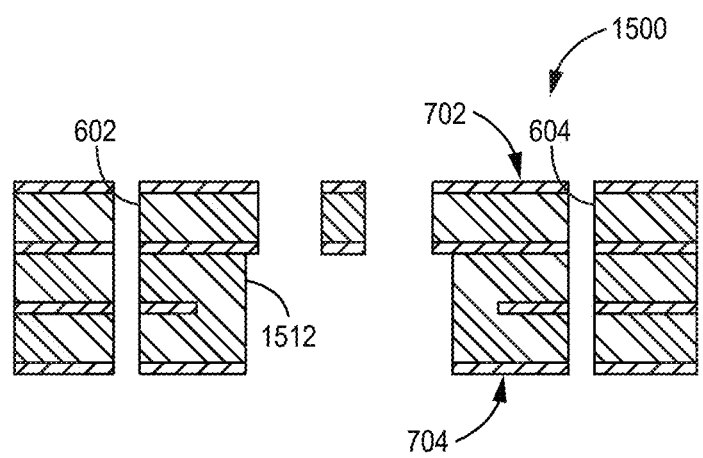
Figure 15G:
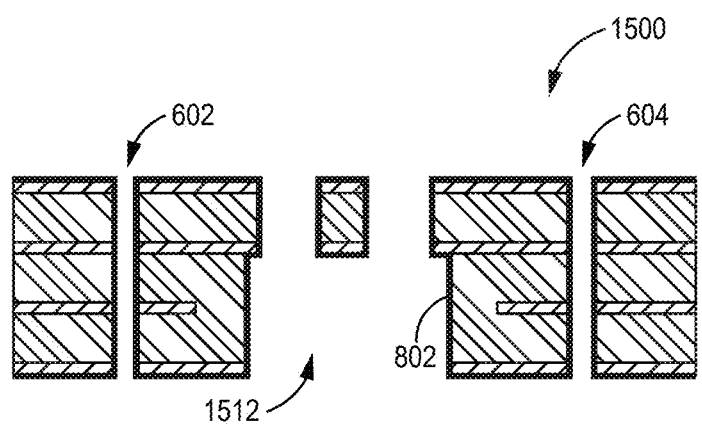

Referring to FIGS. 15D, one or more holes can be drilled in the laminated stack 1500 in the manner described above with respect to FIG. 6. Referring to FIG. 15E-15F, the partial cavities 1502, 1504, 404 formed in the first sub-lam 302 and second sub-lam 304 can be de-capped in the manner described with respect to FIGS. 7A-7B. The de-capping removes portions 1508, 1510 from the first sub-lam 302 and portion 708 from the second sub-lam 304 forming an exposed cavity 1512 that includes each of cavities 1502, 1504, 404, 406. Referring to FIG. 15G, the cavity 1512 can be plated in the manner described with respect to FIGS. 8, 9A, and 9B. Additional material sheets can be added to the laminated stack 1500 as described above with respect to FIGS. 10 and 16A-D. The resulting laminated stack, can be processed in the manner described above with respect to blocks 11-13 to form a PCB having a thermal pathway that includes the cavity 1512.

What is claimed is:

1. A method of fabricating a printed circuit board, the method comprising:
    milling a first cavity in a first sub-lam, wherein the first cavity extends partially through the first sub-lam;
    milling a second cavity in a prepreg layer;
    stacking the first sub-lam, the prepreg layer, and a material sheet to form a stack wherein the prepreg layer is disposed between the first sub-lam and the material sheet, wherein stacking includes aligning the first cavity and the second cavity, and orienting the first sub-lam such that the first cavity opens toward the second cavity forming a composite cavity from the first cavity and the second cavity;
    laminating the stack including the first sub-lam, the prepreg layer, and the material sheet to form a laminated stack having a first side proximate the first sub-lam and a second side reverse of the first side;
    removing from the laminated stack one or more portions of the first sub-lam covering the first cavity to expose the composite cavity to the first side;
    placing conductive paste in the composite cavity of the laminated stack; and
    sintering the conductive paste in the composite cavity to form one or more thermal pathways in the laminated stack.

2. The method of claim 1, comprising:
    forming a third cavity in the material sheet, wherein the material sheet is a second sub-lam, wherein the third cavity extends partially through the second sub-lam, wherein stacking includes aligning the third cavity with the first cavity and the second cavity and orienting the second sub-lam such that the third cavity opens towards the second cavity such that the composite cavity includes the first cavity, the second cavity, and the third cavity;
    removing from the laminated stack one or more portions of the second sub-lam covering the third cavity to expose the composite cavity to the second side, wherein the one or more thermal pathways extend from the first side to the second side of the laminated stack.

3. The method of claim 2, wherein the conductive paste is composed of at least 90% metal particles and the one or more thermal pathways are composed of at least 90% metal.

4. The method of claim 2, wherein the first cavity, the second cavity, and the third cavity have substantially the same horizontal cross-sectional size and shape.

5. The method of claim 2, wherein removing from the laminated stack one or more portions of the first sub-lam includes removing a portion of the first sub-lam having substantially the same horizontal cross-sectional size and shape as the first cavity, wherein removing from the laminated stack one or more portions of the second sub-lam includes removing a portion of the second sub-lam having substantially the same horizontal cross-sectional size and shape as the third cavity.

6. The method of claim 2, wherein removing from the laminated stack one or more portions of the first sub-lam includes removing one or more portions having a smaller horizontal cross-sectional area than a horizontal cross-sectional area of the first cavity; wherein removing from the laminated stack one or more portions of the second sub-lam includes removing one or more portions having a smaller horizontal cross-sectional area than a horizontal cross-sectional area of the third cavity.

7. The method of claim 2, comprising:
    forming a fourth cavity in the first sub-lam, such that the fourth cavity extends partially through the first sub-lam, wherein stacking includes aligning and orienting the first sub-lam such that the fourth cavity opens towards the second cavity such that the composite cavity includes the first cavity, the second cavity, the third cavity, and the fourth cavity; and
    removing from the laminated stack a portion of the first sub-lam that covers the fourth cavity to expose the fourth cavity to the first side.

8. The method of claim 2, wherein forming a first cavity includes milling the first sub-lam to form the first cavity, wherein forming a second cavity includes milling the prepreg layer to form the second cavity, wherein forming a third cavity includes milling the second sub-lam to form the third cavity.

9. The method of claim 2, wherein a horizontal cross-sectional size or shape of the third cavity is substantially different than the horizontal cross-sectional size or shape of the first cavity.

10. The method of claim 2, wherein the first cavity has a horizontal cross-sectional shape having at least one arm.

11. The method of claim 2, comprising:
milling a fifth cavity in a third sub-lam, wherein the fifth cavity extends partially through the third sub-lam;
milling a sixth cavity in a second prepreg layer;
stacking the third sub-lam, the second prepreg layer, and the laminated stack to form a second stack wherein the prepreg layer is disposed between the third sub-lam and the laminated stack, wherein stacking includes aligning the fifth cavity, the sixth cavity, and the composite cavity and orienting the third sub-lam such that the fifth cavity opens toward the sixth cavity such that the composite cavity includes, the first, second, third, fifth, and sixth cavities;
after removing from one or more portions of the first sub-lam covering the first cavity to expose the composite cavity to the first side, and prior to removing one or more portions of the second sub-lam covering the third cavity to expose the composite cavity to the second side, laminating the second stack such that the laminated stack includes the first, second, and third sub-lam and the first and second prepreg layers, the laminated stack having a third side proximate the third sub-lam, wherein the second side is reverse of the first side; and
removing from the laminated stack one or more portions of the third sub-lam covering the fifth cavity to expose the composite cavity to the third side.

12. A method of fabricating a printed circuit board, the method comprising:
forming a plurality of first cavities in a first sub-lam and a plurality of second cavities in a second sub-lam, wherein the plurality of first cavities extend partially through the first sub-lam and the plurality of second cavities extend partially through the second sub-lam;
forming a plurality of third cavities in a prepreg layer;
stacking the first sub-lam, the second sub-lam, and the prepreg layer such that the prepreg layer is disposed in between the first sub-lam and the second sub-lam, wherein stacking includes aligning the plurality of first cavities and the plurality of second cavities with respective cavities of the plurality of third cavities, wherein stacking includes orienting the plurality of first cavities and the plurality of second cavities to open toward the plurality of third cavities forming a plurality of composite cavities from the plurality of first cavities, the plurality of second cavities, and the plurality of third cavities;
laminating the first sub-lam, the second sub-lam, and the prepreg layer together to form a laminated stack having a first side and a second side;
removing portions of the first sub-lam and the second sub-lam that cover the plurality of first cavities and the plurality of second cavities to expose the plurality of composite cavities to the first side and the second side;
placing conductive paste in the composite cavity; and
sintering the conductive paste in the composite cavity to form a plurality of thermal pathways extending from the first side to the second side of the laminated stack.

13. The method of claim 12, comprising:
milling a fifth cavity in a third sub-lam, wherein the fifth cavity extends partially through the third sub-lam;
milling a sixth cavity in a second prepreg layer;
stacking the third sub-lam, the second prepreg layer, and the laminated stack to form a second stack wherein the prepreg layer is disposed between the third sub-lam and the laminated stack, wherein stacking includes aligning the fifth cavity, the sixth cavity, and the composite cavity and orienting the third sub-lam such that the fifth cavity opens toward the sixth cavity such that the composite cavity includes, the first, second, third, fifth, and sixth cavities;
after removing portions of the first sub-lam covering the first cavities to expose the composite cavities to the first side, and prior to removing portions of the second sub-lam covering the third cavities to expose the composite cavities to the second side, laminating the second stack such that the laminated stack includes the first, second, and third sub-lam and the first and second prepreg layers, the laminated stack having a third side proximate the third sub-lam, wherein the second side is reverse of the first side; and
removing from the laminated stack one or more portions of the third sub-lam covering the fifth cavity to expose the composite cavity to the third side.

14. The method of claim 13, wherein the conductive paste is composed of at least 90% metal particles and the plurality of thermal pathways are composed of at least 90% metal.

* * * * *